(12) United States Patent
Nair et al.

(10) Patent No.: US 6,351,191 B1
(45) Date of Patent: Feb. 26, 2002

(54) DIFFERENTIAL DELAY CELL WITH COMMON DELAY CONTROL AND POWER SUPPLY

(75) Inventors: Rajendran Nair, Hillsboro; Stephen R. Mooney, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/584,565

(22) Filed: May 31, 2000

(51) Int. Cl.[7] .......................... H03B 5/24; H03L 7/099; H03H 11/26; H03K 3/00
(52) U.S. Cl. ................... 331/57; 331/34; 331/177 R; 327/158; 327/159; 327/280; 327/287
(58) Field of Search ................... 331/34, 57, 177 R; 327/261, 274, 280, 287, 156–159

(56) References Cited

U.S. PATENT DOCUMENTS 5,440,277 A * 8/1995 Ewen et al. ................ 331/176
5,714,912 A * 2/1998 Fiedler et al. ............... 331/57
5,909,150 A * 6/1999 Kostelnik et al. ............ 331/34

OTHER PUBLICATIONS

Gutnik, V., et al., "TA 10.5 Active GHz Clock Network Using Distributed PLLs", *2000 IEEE International Solid-State Circuits Conference*, pp. 174–175, (Feb. 2000).

* cited by examiner

*Primary Examiner*—David Mis
(74) *Attorney, Agent, or Firm*—Schwegman, Lundberg, Woessner & Kluth, P.A.

(57) ABSTRACT

A differential delay cell includes load transistors and a current source transistor biased linearly. The delay control input of the differential delay cell is also the power supply input such that when the power supply voltage changes, the delay in the differential delay cell changes. The resistance presented by the load transistors changes as a function of the power supply voltage, as does the current sourced by the variable current source. The combination of changing resistance and changing current as the power supply voltage changes results in a substantially constant output voltage swing. A ring of differential delay cells is included in a voltage controlled oscillator, which is in turn included in a phase lock loop. The phase lock loop has a wide loop bandwidth and the voltage controlled oscillator has a good power supply rejection ratio.

26 Claims, 4 Drawing Sheets

DIFFERENTIAL DELAY CELL WITH COMMON DELAY CONTROL AND POWER SUPPLY

FIELD

The present invention relates generally to delay cells, and more specifically to differential delay cells having variable delay.

BACKGROUND OF THE INVENTION

Continual process and voltage scaling in very large scale integration (VLSI) design introduces significant challenges in the design of circuits such as phase lock loops (PLLs), delay lock loops (DLLs), and delay cells included therein. Increasing frequencies of operation and reducing power supply voltages impose reduced uncertainty margins and tighter design tolerances.

FIG. 1 shows a prior art differential delay cell. Delay cell 100 includes saturated load devices 106 and 108 and voltage controlled resistive (VCR) devices 102 and 104 coupled as parallel load devices to the two legs of a traditional differential amplifier configuration. Delay cell 100 also includes a constant current source 120 operating in saturation. Through the high output impedance of current source 120, the currents in the differential legs of the circuit are largely independent of the power supply voltage or the input common mode voltage.

The combination of load devices 106 and 108 and VCR devices 102 and 104 produce a substantially linear resistance characteristic. The VCR devices are added to the standard differential amplifier configuration to linearize the characteristics of the otherwise saturated load devices. The delay value from the differential inputs to the differential outputs is controlled by changing the bias voltage present on delay control node 130.

Despite the differential nature of the circuit, delay cell 100 displays power supply sensitivity because of the nature of the control of VCR devices 102 and 104. Load devices 102 and 104 are biased by the difference between the power supply voltage on node 110 and the voltage on delay control node 130. If the power supply voltage changes, the bias on VCR devices 102 and 104 changes, and the resistance changes, causing the delay through the differential delay cell to change. As a result, when the power supply voltage changes rapidly, significant jitter can appear on the differential outputs of delay cell 100. Typical approaches to reduce these delay variations include closely coupling the power supply and the delay control node so that noise on the power supply is coupled to the delay control node to reduce the bias variations on the delay control node.

In a phase lock loop, delay cells are typically driven by the output of a loop filter. One known method of closely coupling the delay control node and the power supply is to configure the output capacitance of the loop filter such that high frequency power supply noise is coupled to the delay control node. This can have the undesirable effect of reducing the loop filter bandwidth, which also reduces the bandwidth of the phase lock loop.

For the reasons stated above, and for other reasons stated below which will become apparent to those skilled in the art upon reading and understanding the present specification, there is a need in the art for an alternate method and apparatus to generate a variable delay.

DESCRIPTION OF EMBODIMENTS

Figure 1:
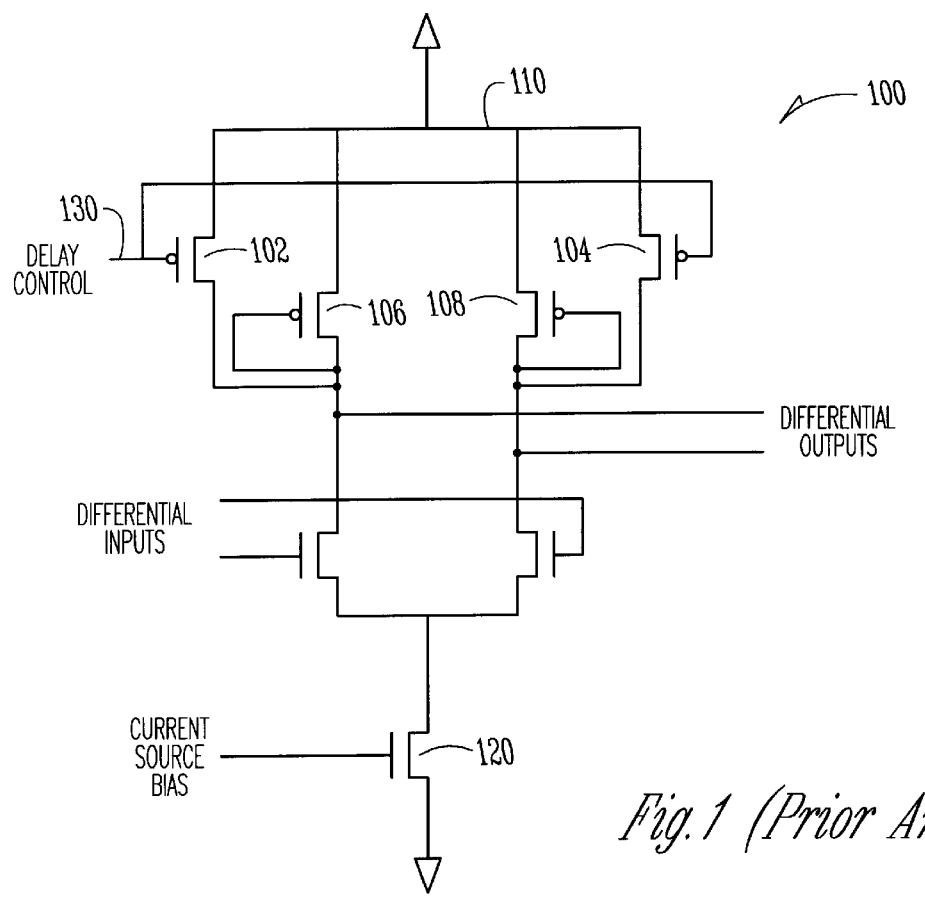
FIG. 1 shows a prior art differential delay cell.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism that combines the power supply input node and the delay control node of a differential delay cell. Input to output delay of the differential delay cell increases as the voltage on the power supply input node decreases, and the delay decreases as the voltage on the power supply input node increases. Because the power supply input node and the delay control node are one and the same, there is no need to closely capacitively couple a control input to a power supply, and bandwidth is not limited as a result thereof.

The differential delay cell includes linearly biased load transistors in a cascode arrangement between the power supply input node and the input transistors. The differential delay cell also includes a linearly biased variable current source coupled between the input transistors and a reference node such as a node at ground potential. As the voltage on the power supply input node is decreased, the resistance presented by the load transistors increases, and the current in the variable current source decreases. Likewise, as the voltage on the power supply input is increased, the resistance presented by load devices decreases, and the current in the variable current source increases. As a result of the increase in load resistance, the delay through the delay cell increases. Also as a result, the output voltage swing remains substantially constant as the voltage on the power supply input node changes.

Figure 2:
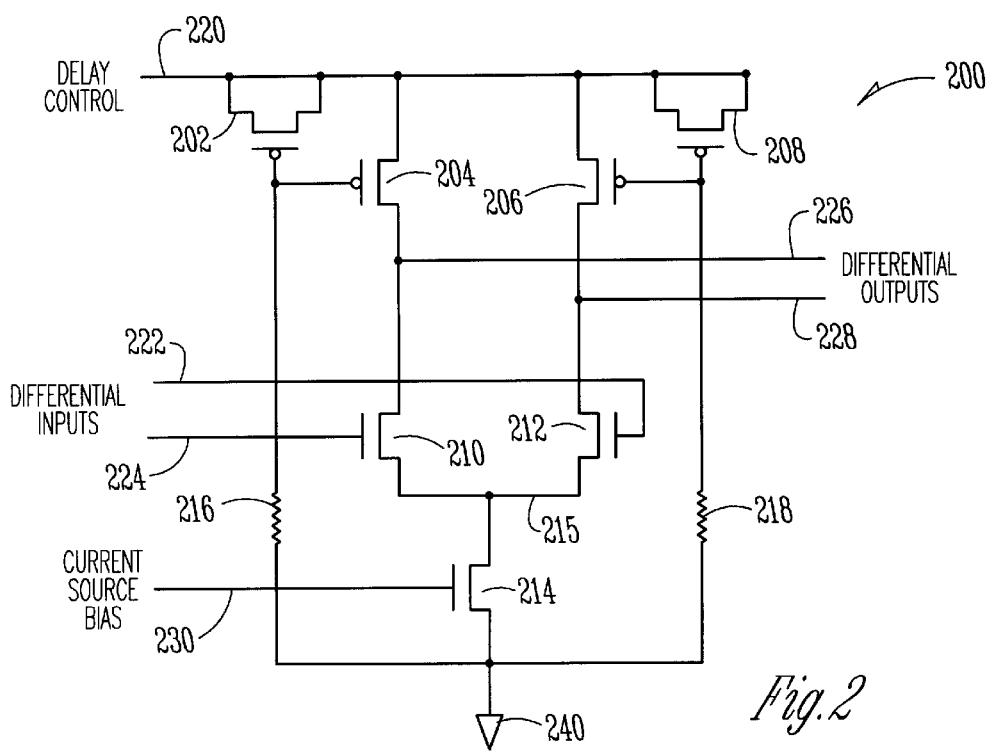
FIG. 2 shows a differential delay cell in accordance with an embodiment of the present invention.

FIG. 2 shows a differential delay cell in accordance with an embodiment of the present invention. Differential delay cell 200 includes input transistors 210 and 212, load transistors 204 and 206, and variable current source 214. Input transistors 210 and 212 are controlled by gate voltages on differential input nodes 222 and 224. When differential input node 222 and has a high voltage impressed thereon, and differential input node 224 has a low voltage impressed thereon, the current sourced by variable current source 214 flows through transistors 206 and 212, with more current through transistor 206 and less through 212. As a result, differential output node 226 has a high voltage impressed thereon and differential output node 228 has a low voltage impressed thereon, thereby providing a differential output. Likewise, when transistor 210 is on, and transistor 212 is off, current flows in load transistor 204 and not in load transistor 206. As a result, output node 226 presents a low voltage, and output 228 presents a high voltage.

Variable current source 214 includes a transistor biased to operate in a linear region. The current source bias voltage on node 230 is referenced relative to reference node 240 such that variable current source 214 operates linearly. As a result, the current flowing in variable current source 214 varies as the drain-to-source voltage of the transistor varies. For example, when the voltage on node 215 changes, the current in variable current source 214 also changes. Because the current flowing in variable current source 214 changes as a function of the voltage across the device, the current source is termed a "variable current source" rather than a "constant current source."

Load transistors 204 and 206 are also biased to operate in a linear region. Resistors 216 and 218 couple the gates of load transistors 204 and 206, respectively, to a reference potential on reference node 240. This ensures that load transistors 204 and 206 are biased to operate in a linear (or non-saturated) region. Because load transistors 204 and 206 are biased to operate in a linear region, they present different values of load resistance to input transistors 210 and 212 as a function of the voltage across the devices. For example, as the gate-to-source voltage across load transistor 204 (which is the same as the power supply voltage) decreases, the resistance presented thereby increases. Likewise, as the gate-to-source voltage increases, the resistance decreases. Load transistors 204 and 206 are examples of load devices with bias input nodes that have a linear characteristic. Any type of load device with a suitable bias input node can be substituted for load transistors 204 and 206 without departing from the scope of the present invention.

Differential delay cell 200 has a common power supply node and delay control node, shown as delay control node 220. Current to operate differential delay cell 200 is provided by the device that drives delay control node 220. As the voltage on delay control node 220 changes, the resistance of load transistors 204 and 206 changes, as does the current flow in variable current source 214. In some embodiments, load transistors 204 and 206 and variable current source 214 are biased such that the product of the resistance and the current is substantially constant. This results in a substantially constant output voltage swing. As a result, the voltage on delay control node 220 can vary while the output voltage swing remains substantially constant.

Because load transistors 204 and 206 operate in their linear region, they still operate as expected with a very small source-to-drain voltage. Similarly, variable current source 214 coupled between input transistors 210 and 212 and reference node 240 also operates in a linear region. Because load transistors 204 and 206 and variable current source 214 operate in a linear region, the power supply voltage can drop quite far while still maintaining adequate output voltage swing. As a result, differential delay cell 200 is capable of operating at very high frequencies with very low supply voltage.

Transistors 202 and 208 are configured as capacitors that are coupled to the gates of load transistors 204 and 206. Transistors 202 and 208 combine with resistors 216 and 218 to create single pole filters that reduce the consequences of high frequency noise on delay control node 220. Delay control node 220 is not unnecessarily loaded because of the presence of the series resistor between the capacitor and reference node 240. The capacitor is not essential, but its presence improves high frequency noise rejection characteristics of differential delay cell 200 by augmenting parasitic capacitances in transistors 204 and 206.

Figure 3:
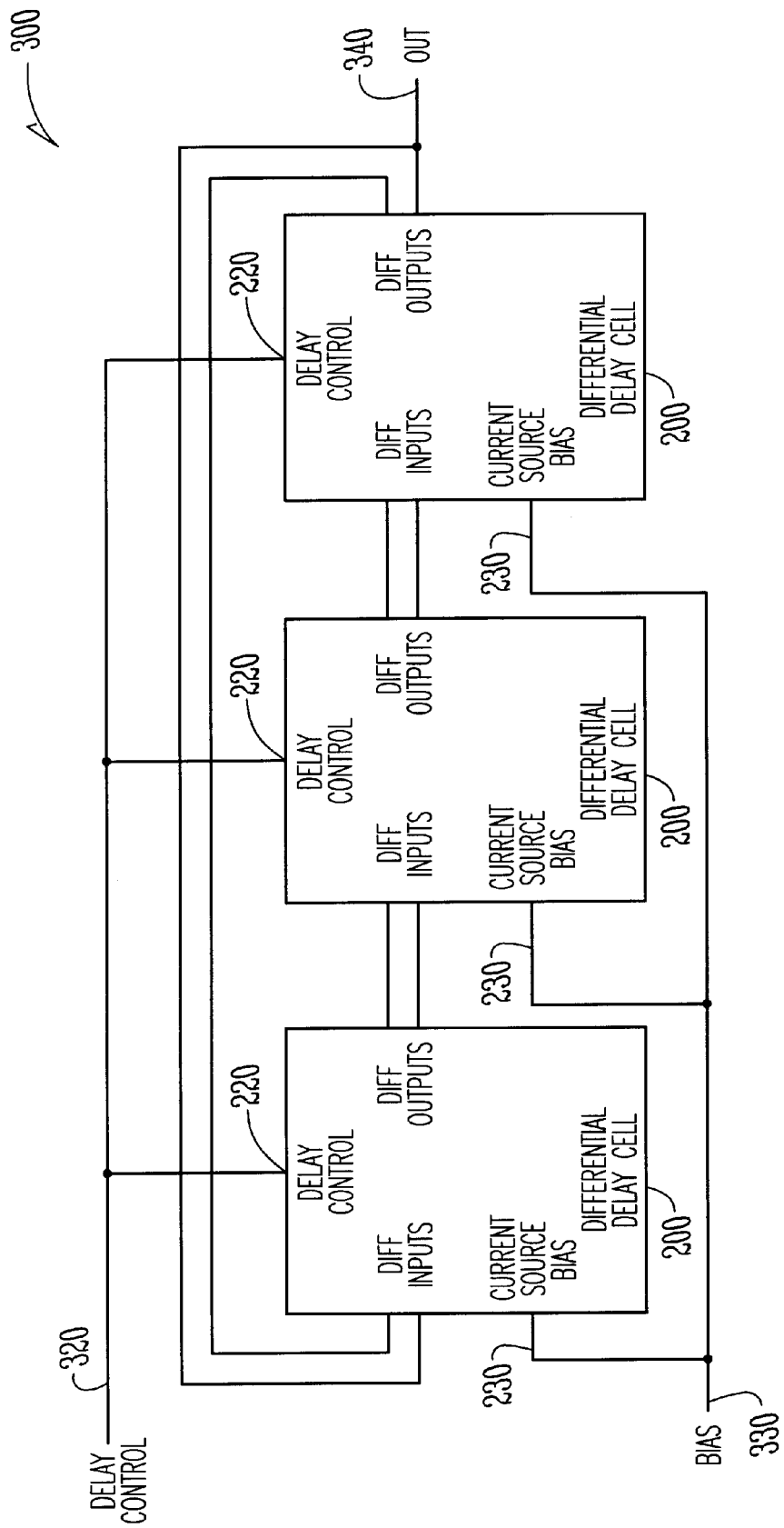
FIG. 3 shows a voltage controlled oscillator.

FIG. 3 shows a voltage controlled oscillator (VCO). VCO 300 includes a number of differential delay cells 200 configured in a ring. VCO 300 is shown with three differential delay cells 200, but any number can be used. An odd number (three) is shown because an odd number of inversions are used to make the ring oscillate. An even number of differential delay cells 200 can be used to generate a desired free-running frequency, with some delay cells implementing buffers and some delay cells implementing inverters.

Each differential delay cell 200 has differential outputs coupled to the differential inputs of a subsequent differential delay cell, and also has differential inputs coupled to the differential outputs of a previous differential delay cell. If the polarity of the differential outputs are different from the polarity of the inputs, then an inverter is formed. If the polarity is not different, then a buffer is formed. The free-running frequency at which VCO 300 oscillates is approximately equal to the inverse of twice the sum of the delays present in each of the differential delay cells when the voltage on delay control node 320 is at a nominal value.

The delay control inputs 220 of the differential delay cells 200 are coupled to a common delay control input node 320 of VCO 300. Delay control input node 320 functions as a power supply node for differential delay cells 200, and also functions as a delay control node. As the voltage on delay control node 320 is changed, the delays in differential delay cells 200 changes, and the frequency of VCO 300 changes. In some embodiments, the frequency variation of VCO 300 varies substantially linearly with the voltage on delay control input node 320. Such linear frequency variation implies a non-linear delay variation with control voltage, which can be useful in phase lock loops in part because such control is well-matched with commonly used proportional phase error detectors. When frequencies of operation are high, delays are low, and the correction produced by a change in control voltage is correspondingly small.

Figure 4:
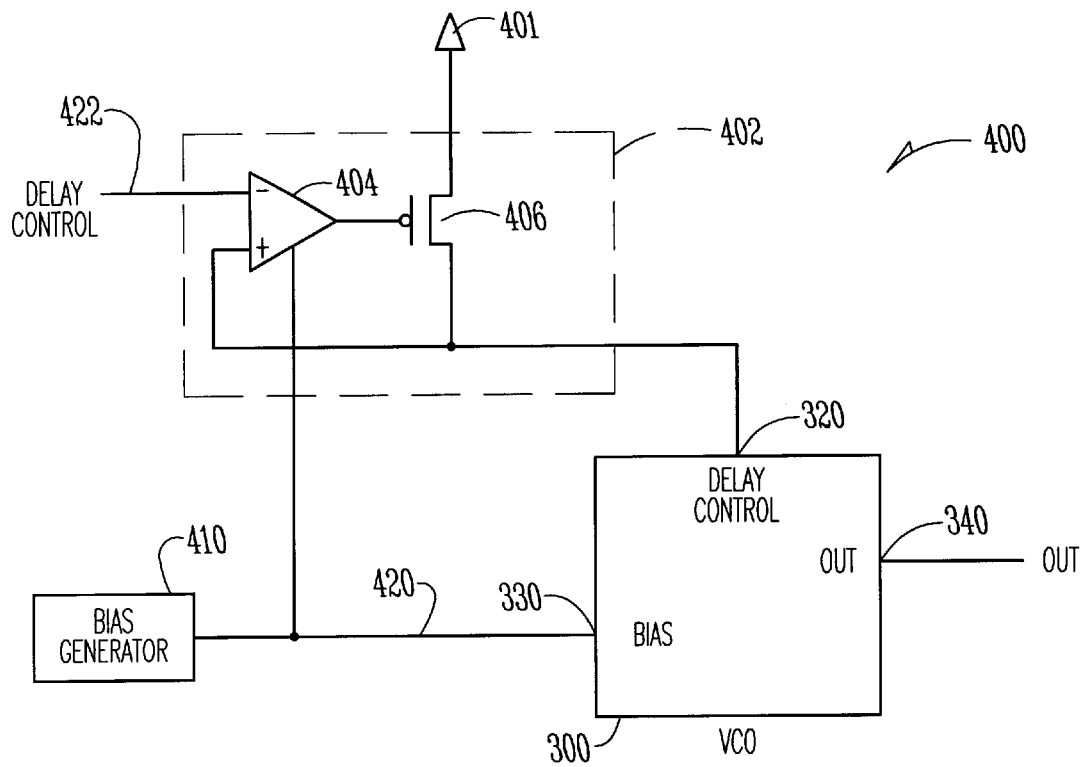
FIG. 4 shows a voltage controlled oscillator that includes a voltage buffer.

FIG. 4 shows a voltage controlled oscillator that includes a voltage buffer. VCO 400 includes VCO 300, voltage buffer 402, and bias generator 410. Voltage buffer 402 is a high speed analog buffer that serves as a translator that converts a high impedance control node (such as a loop filter output) to a low impedance power node without significant loss in bandwidth.

In some embodiments, voltage buffer 402 includes unity gain amplifier 404 and power device 406. Unity gain amplifier 404 receives a control voltage on delay control node 422, and drives power device 406. Power device 406 drives delay control node 320 of VCO 300, provides enough current to act as a power supply for VCO 300, and also varies the frequency of VCO 300 by varying the voltage on delay control node 320 as a function of the voltage on delay control node 422.

Buffer 402 has a power supply rejection ratio associated therewith. Buffers are generally capable of rejecting power supply noise up to a certain frequency. Beyond this upper frequency, buffers typically reflect power supply noise on their output node because they are unable to respond quickly enough to remove the high frequency noise. Since noise on main power input node 401 is largely rejected by the regulating action of voltage buffer 402, very little noise from power supply input node 401 is present on output node 320 of buffer 402. The capacitors, shown as transistors 202 and 208 in FIG. 2, coupled to the gates of the load transistors reduce the impact of any remaining high frequency noise transmitted from the power supply input node 401, through buffer 402, to differential delay cells 200. This allows for very high control bandwidths for the VCO architecture without compromising the VCO jitter characteristics.

The addition of voltage buffer 402 provides isolation between the circuit driving voltage buffer 402 at node 422 and VCO 300. By providing this isolation, the bandwidth of the circuit driving voltage buffer is not constrained by the input capacitance of VCO 300.

Bias generator 410 is a circuit that generates a bias voltage on node 420 for use in voltage buffer 402 and VCO 300. In some embodiments, such as the embodiment shown in FIG. 4, a common bias generator is used to bias multiple devices, and in other embodiments, multiple bias generators exist. In other embodiments, a self biasing amplifier is implemented within buffer 402, and no external bias is provided.

Figure 5:
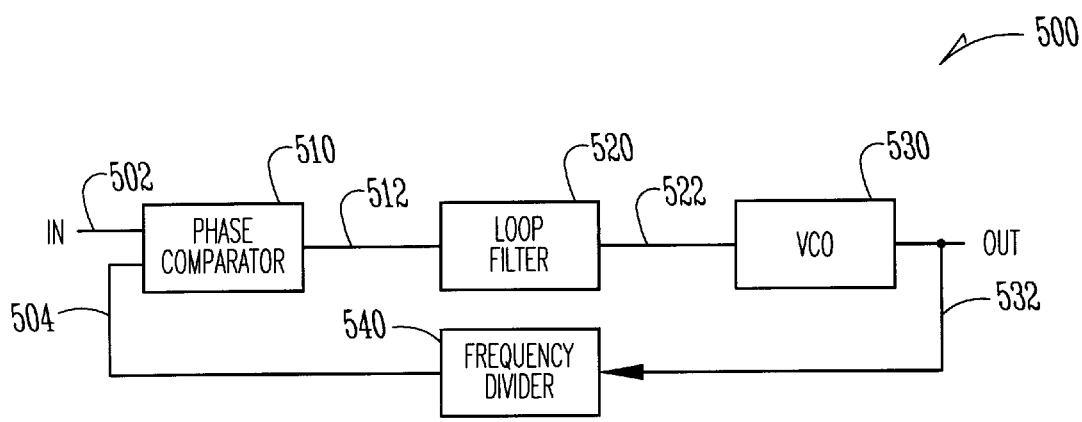
FIG. 5 shows a phase lock loop.

FIG. 5 shows a phase lock loop. Phase lock loop 500 includes phase comparator 510, loop filter 520, VCO 530, and frequency divider 540. Phase comparator 510 compares the phase of signals on nodes 502 and 504, and generates an error signal on node 512. Loop filter 520 filters the error signal and drives VCO 530 with a filtered signal on node 522. Frequency divider 540 divides the frequency of the output signal present on node 532 to produce the signal on node 504. In embodiments that include frequency divider 540, phase lock loop 500 functions as a frequency multiplier. In some embodiments, frequency divider 540 is not present. In these embodiments, the frequency of the signal on node 532 is substantially the same as that on node 502.

VCO 530 is a VCO that implements an embodiment of a differential delay cell in accordance with the present invention. For example, VCO 530 can be implemented as VCO 300 (FIG. 3) or VCO 400 (FIG. 4). When VCO 400 is implemented, loop filter 520 is isolated from the differential delay cell by voltage buffer 402. As a result, the power supply rejection capability of the VCO is decoupled from the loop filter characteristics. The buffer coupled between the loop filter and the VCO provides isolation, and any high frequency power supply noise present on the output of buffer 402 (FIG. 4) is reduced by the capacitors formed by transistors 202 and 208 (FIG. 2) within the differential delay cell. As a result, the loop bandwidth of phase lock loop 500 can be significantly increased without degrading power supply rejection ratio. This enables very high frequency, stable, phase lock loops to be designed.

Figure 6:
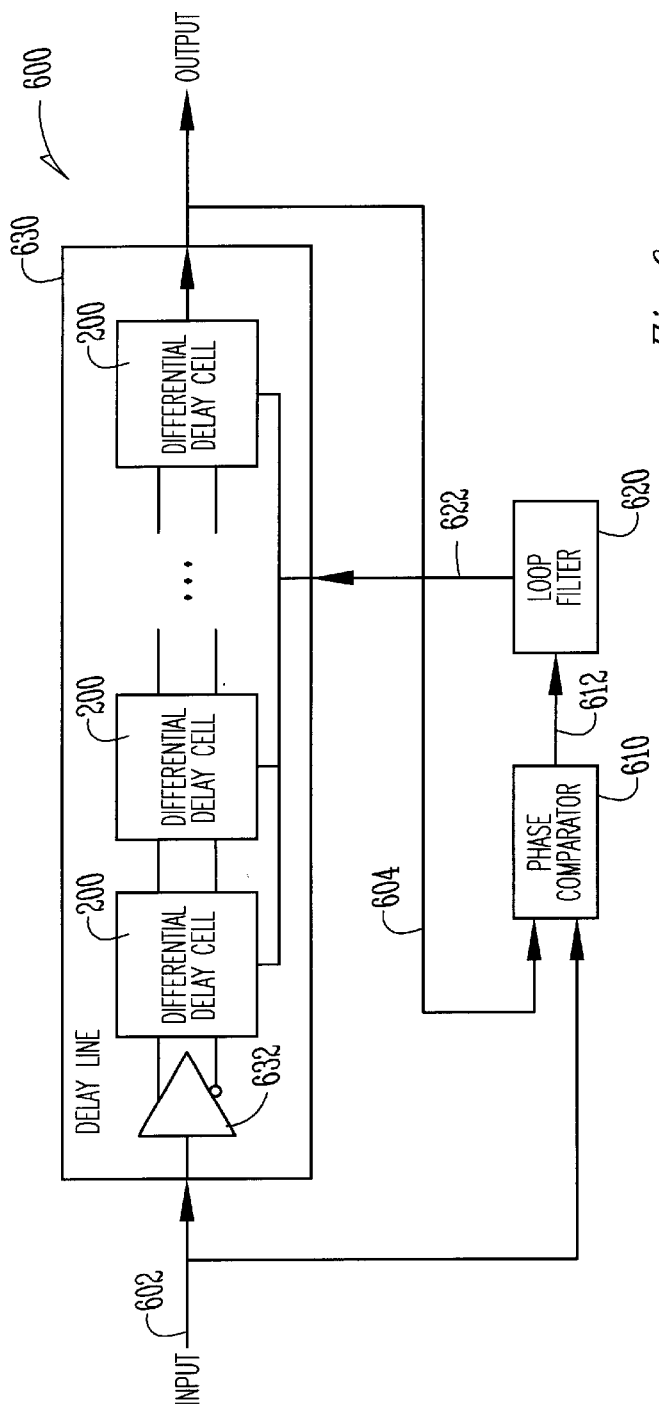
FIG. 6 shows a delay lock loop.

FIG. 6 shows a delay lock loop. Delay lock loop 600 includes phase comparator 610, loop filter 620, and delay line 630. Phase comparator 610 compares the phase of signals on nodes 602 and 604, and generates an error signal on node 612. Loop filter 620 filters the error signal and adjusts the delay of delay line 630 with a filtered signal on node 622. The action of phase comparator 610 and loop filter 620 combine to control the delay of delay line 630 such that delay line 630 produces a delay substantially equal to an integer number of periods. In some embodiments, the input signal on input node 602 is a clock signal, and delay line 630 produces a delay substantially equal to an integer number of clock periods.

Delay line 630 is a delay line that implements an embodiment of a differential delay cell in accordance with the present invention. For example, in the embodiment shown in FIG. 6, delay line 630 includes a chain of differential delay cells 200 (FIG. 2). Delay line 630 receives a signal on input node 602 and produces a delayed version of the signal on output node 604. In some embodiments, differential driver 632 is included within delay line 630 to produce a differential signal from a single-ended signal. In other embodiments, input node 602 is a differential input node and differential driver 632 is omitted.

Differential delay cells, VCOs, phase lock loops, and delay lock loops of the present invention can be implemented in many ways. In some embodiments, they are implemented in integrated circuits as part of a clock recovery or distribution system. In other embodiments, they are implemented as high speed serial transceivers. In some embodiments, design descriptions of the various embodiments of the present invention are included in libraries that enable designers to include them in custom or semi-custom designs. For example, differential delay cell 200 (FIG. 2) can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, differential delay cell 200 can be represented as polygons assigned to layers of an integrated circuit.

Figure 7:
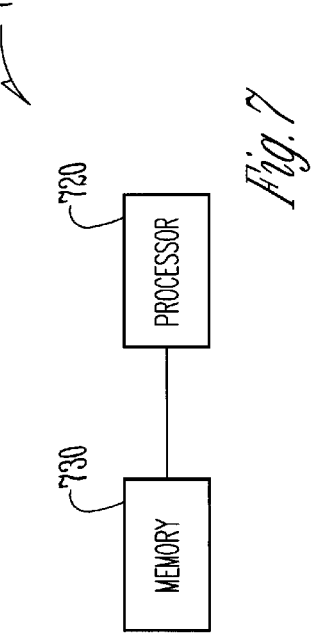
FIG. 7 shows a processing system.

FIG. 7 shows a processing system. Processing system 700 includes processor 720 and memory 730. In some embodiments, processor 720 represents a computer that generates design descriptions according to embodiments of the invention. In other embodiments, processor 720 represents a computer that utilizes design descriptions in the design of integrated circuits. Processing system 700 can be a personal computer (PC), mainframe, handheld device, portable computer, settop box, or any other system that includes software.

Memory 730 represents an article that includes a machine readable medium. For example, memory 730 represents any one or more of the following: a hard disk, a floppy disk, random access memory (RAM), read only memory (ROM), flash memory, CDROM, or any other type of article that includes a medium that can be read, either directly or indirectly, by processor 720. Memory 730 can store design descriptions of the various embodiments of the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A differential delay cell comprising:
   a first input transistor and a second input transistor;
   a first load transistor coupled drain to source between the first input transistor and a delay control input node, the first load transistor having a first gate;
   a first resistor coupled between the first gate and a reference node;
   a second load transistor coupled drain to source between the second input transistor and the delay control input node, the second load transistor having a second gate;
   a second resistor coupled between the second gate and the reference node; and a variable current source coupled between the first and second input transistors and the reference node, the variable current source being configured such that a current sourced by the variable current source changes responsive to changes in voltage on the delay control input node.

2. The differential delay cell of claim 1 wherein each of the load transistors includes a parasitic capacitance between the respective gate and the delay control input node, the differential delay cell further comprising:

a first capacitor coupled between the first gate and the delay control input node; and a second capacitor coupled between the second gate and the delay control input node.

3. The differential delay cell of claim 1 wherein the variable current source is configured to operate in a substantially linear region such that when a voltage across the variable current source varies, the current sourced thereby varies substantially linearly.

4. The differential delay cell of claim 3 wherein the variable current source includes a bias input node having a bias referenced relative to the reference node.

5. The differential delay cell of claim 2 wherein:

the first capacitor comprises a metal oxide semiconductor transistor having a gate coupled to the first gate and having a source and a drain coupled to the delay control input node.

6. The differential delay cell of claim 5 wherein:

the second capacitor comprises a metal oxide semiconductor transistor having a gate coupled to the second gate and having a source and a drain coupled to the delay control input node.

7. A differential delay cell comprising:

a power supply input node;

a first load transistor and a second load transistor;

a first resistor and a second resistor;

a first input transistor and a second input transistor; and a current source;

wherein the current source, first and second input transistors, and first and second load transistors are coupled in a differential amplifier configuration, and wherein the first and second load transistors are configured to be biased in a linear region by the first and second resistors coupled between gates of the first and second load transistors and a reference node coupled to the current source such that resistance values presented the first and second load transistors are a function of a voltage on the power supply input node.

8. The differential delay cell of claim 7 wherein the current source comprises:

a transistor configured to be biased in a linear region of operation such that a current sourced thereby is a function of the voltage on the power supply input node.

9. The differential delay cell of claim 8 wherein the resistance values of the load transistors and the current are inversely related such that a change in the voltage on the power supply input node causes a delay change through the differential delay cell without causing a substantial change in output voltage swing.

10. The differential delay cell of claim 9 further comprising a first filter coupled between the power supply input node and the first input transistor.

11. The differential delay cell of claim 10 wherein the first filter comprises:

a capacitor coupled between the power supply input node and a gate of the first input transistor; and the resistor coupled between the gate of the first input transistor and the reference node.

12. The differential delay cell of claim 11 wherein the capacitor comprises:

a metal oxide semiconductor transistor having source and drain nodes coupled to the power supply input node and a gate coupled to the gate of the first input transistor.

13. A voltage controlled oscillator including a plurality of delay cells configured in a ring, wherein each of the plurality of delay cells comprises:

a differential input node coupled to a previous delay cell and a differential output node coupled to a subsequent delay cell;

a delay control input node coupled to a common delay control input node of the voltage controlled oscillator;

a pair of load transistors coupled between the delay control input node and the differential input node in a cascode arrangement; and a pair of resistors, each coupled between a gate node of a corresponding load transistor and a reference node, such that each of the pair of load transistors is configured to operate in a substantially linear region such that a load resistance presented thereby is a function of a voltage on the delay control input node.

14. The voltage controlled oscillator of claim 13 wherein each of the plurality of delay cells further comprises:

a variable current source configured to change the amount of current sourced thereby as a function of the voltage on the delay control input node; and a pair of input transistors coupled between the variable current source and the pair of load transistors.

15. The voltage controlled oscillator of claim 13 further comprising a pair of capacitors, each being coupled between the delay control input node and the gate node of a corresponding one of the pair of load transistors.

16. The voltage controlled oscillator of claim 14 further comprising an input buffer coupled to the common delay control input node, the input buffer configured to drive the delay control input nodes of each of the plurality of differential delay cells.

17. A phase lock loop device comprising:

a phase comparator;

a loop filter responsive to the phase comparator; and a voltage controlled oscillator responsive to the loop filter, wherein the voltage controlled oscillator includes:

a differential delay cell having load transistors configured to be biased in a substantially linear region, having first and second resistors, each coupled between a gate node of a corresponding load transistor and a reference node, and further configured to have a drain-to-source voltage responsive to the loop filter such that a delay of the differential delay cell changes responsive to the loop filter.

18. The phase lock loop device of claim 17 further comprising a voltage buffer coupled between the loop filter and the voltage controlled oscillator such that the delay of the differential delay cell changes responsive to the voltage buffer.

19. The phase lock loop device of claim 18 wherein the differential delay cell is configured in a differential amplifier configuration having the reference node and a power supply input node, the power supply input node being coupled to an output node of the voltage buffer.

20. A delay lock loop device comprising:

a phase comparator;

a loop filter responsive to the phase comparator; and a delay line responsive to the loop filter, wherein the delay line includes:

a differential delay cell having load transistors configured to be biased in a substantially linear region, having first and second resistors, each coupled between a gate node of a corresponding load transistor and a reference node, and further configured to have a drain-to-source voltage responsive to the loop filter such that a delay of the differential delay cell changes responsive to the loop filter.

21. The delay lock loop device of claim 20 wherein the differential delay cell further comprises a variable current source configured such that a current sourced thereby is a function of the loop filter.

22. The delay lock loop device of claim 20 wherein the differential delay cell further comprises:

a first input transistor and a second input transistor; and a current source;

wherein the current source, first and second input transistors, and the load transistors are coupled in a differential amplifier configuration, and wherein the load transistors are configured such that resistance values presented thereby are a function of a voltage on a node coupling the loop filter to the differential delay cell.

23. An article having a computer readable medium, the computer readable medium having a design description stored thereon, the design description including a differential delay cell comprising:

a first input transistor and a second input transistor;

a variable current source coupled between the first and second input transistors and a reference node;

a first load transistor coupled in a cascode arrangement between a delay control input and the first input transistor;

a first resistor coupled between a gate of the first load transistor and the reference node;

a second load transistor coupled in a cascode arrangement between the delay control input and the first input transistor; and a second resistor coupled between a gate of the second load transistor and the reference node.

24. The article of claim 23 wherein the design description is in a hardware design language.

25. The article of claim 23 wherein the design description is described in a hard macro.

26. The article of claim 23 wherein the design description further includes a plurality of differential delay cells configured in a ring to form a voltage controlled oscillator.

* * * * *